United States Patent
Moriuchi

(10) Patent No.: US 6,565,706 B2
(45) Date of Patent: May 20, 2003

(54) SUPPORT-FRAME BONDING APPARATUS

(75) Inventor: Akihiro Moriuchi, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 169 days.

(21) Appl. No.: 09/871,371

(22) Filed: May 31, 2001

(65) Prior Publication Data

US 2001/0037862 A1 Nov. 8, 2001

(30) Foreign Application Priority Data

Jun. 2, 2000 (JP) .................................... 2000-165970

(51) Int. Cl.⁷ ................................................ B30B 5/02
(52) U.S. Cl. .................... 156/583.3; 156/289; 156/383; 100/211; 100/295; 29/739
(58) Field of Search .............................. 156/580, 583.1, 156/583.3, 583.91, 323, 289; 100/211, 295; 29/739, 740

(56) References Cited

U.S. PATENT DOCUMENTS

| | | | |
|---|---|---|---|
| 4,154,882 A | * 5/1979 | Ungar et al. ................ | 428/165 |
| 4,737,208 A | * 4/1988 | Bloechle et al. ............. | 156/90 |
| 4,857,400 A | * 8/1989 | Kloss. Jr. ..................... | 428/334 |
| 5,972,140 A | * 10/1999 | Hass et al. ................ | 156/89.11 |
| 6,270,879 B1 | * 8/2001 | Tachibana et al. .......... | 428/209 |

FOREIGN PATENT DOCUMENTS

JP        11-163212        6/1999

* cited by examiner

Primary Examiner—Jeff H. Aftergut
Assistant Examiner—John T. Haran
(74) Attorney, Agent, or Firm—Katten Muchin Zavis Rosenman

(57) ABSTRACT

A support-frame bonding apparatus has an upper pressing member to which a semiconductor device is supplied and a lower pressing member to which a support frame is supplied. An elastic member is provided to the lower surface of a pressing tool in the upper pressing member. The elastic member is formed of a conductive silicon rubber having a satin finish on the side facing the semiconductor device. The outline of the area of the elastic member contacting the semiconductor device is substantially identical to the outline of an adhesive layer. The semiconductor device and the support frame are superposed via the adhesive layer and pressed against each other, the support frame being heated by the pressing stage. Thus, the semiconductor device is bonded to the support frame via the adhesive layer. The satin finish on the surface of the elastic member prevents the elastic member from sticking to the semiconductor device.

12 Claims, 4 Drawing Sheets

SUPPORT-FRAME BONDING APPARATUS

BACKGROUND OF THE INVENTION

1. Field of the Invention

The present invention relates to a support-frame bonding apparatus for bonding a support frame to a semiconductor device mounted on a tape-automated bonding (TAB) tape such as a tape ball grid array (T-BGA). Particularly, it relates to a support-frame bonding apparatus which can realize a satisfactory bond without causing voids in the adhesive, regardless of the shape of the semiconductor device or the support frame.

2. Description of the Related Art

There is an increasing demand for the reduction in size and increase in density of semiconductor devices. In response, surface-mounting semiconductor devices such as ball grid arrays (BGA) are being used with increasing frequency. Of those BGAs, ones employing as a package material a TAB tape in which a wiring pattern is formed are called T-BGAs. Generally, a T-BGA is used with a support frame attached to it which is formed of a copper plate, for example, for the purposes of improving mechanical strength and reducing thermal resistance.

When attaching such a support frame to semiconductor devices such as a T-BGA, a support-frame bonding apparatus is used whereby the frame and the semiconductor device are bonded to each other by an adhesive through a high-temperature pressure bonding process. In accordance with the conventional bonding apparatus, a T-BGA, for example, is placed on the support frame on which an adhesive layer is formed, and the two members are pressed against each other by heated metal plates to thereby establish a bond. Such conventional support-frame bonding apparatus, however, has the following disadvantages. That is, neither the support frame nor the semiconductor device is always flat; they are often warped on the edges. Furthermore, the semiconductor devices such as T-BGAs, on which semiconductor chips and wirings are mounted, have irregular surface profiles. These facts result in a failure to uniformly apply the bonding pressure by the metal plates. So, some portions of the device and/or the support frame are in a failure to receive enough bonding pressure. Such portions tend to cause quality defects including voids in the adhesive and separation between the semiconductor device and the support-frame. If there are voids in the adhesive, they can burst during the high-temperature test in the inspection step, causing the semiconductor device to be peeled from the support frame.

To overcome those problems, it has been proposed, as disclosed in Japanese Patent Laid-Open Publication No. Hei. 11-163212, to attach an elastic member to the metal plate for pressing the semiconductor device and support frame, so that the bonding pressure can be uniformly distributed.

Yet this counter-measure also has the disadvantage that after the semiconductor device has been pressure-bonded to the support frame, the elastic m often sticks to and remains on the semiconductor device and/or the support frame, possibly causing operational failure in the support-frame bonding apparatus.

SUMMARY OF THE INVENTION

Accordingly, it is an object of the present invention to provide a support-frame bonding apparatus which can bond the support frame to the semiconductor device such as a T-BGA without causing the elastic member for the uniform distribution of bonding pressure to be attached to either the semiconductor device or the support frame.

The support-frame bonding apparatus according to the present invention bonds, via an adhesive layer, the support frame to a semiconductor device mounted on a TAB tape. The support-frame bonding apparatus comprises at least one of an elastic member, a pressing unit and a heating unit. The elastic member has a satin finish on its surface. The pressing unit presses the semiconductor device, the adhesive layer, the support frame and elastic member each other. The semiconductor device and the support frame are superposed via the adhesive layer. The at least one of elastic member is provided to at least one of the outer surfaces of the semiconductor device and the support frame which are not the superposed surfaces of the semiconductor device and the support frame so as to contact the satin finish surface with the outer surface of the semiconductor device or the support frame. The heating unit heats the adhesive layer to bond the semiconductor device to the support frame via the adhesive layer.

In the present invention, the elastic member with a satin finish provided thereon helps to prevent the sticking of the elastic member to the semiconductor device and/or the support frame after bonding the support frame to the semiconductor device, as well as helping to uniformly distribute the bonding pressure applied to the adhesive layer.

The pressing unit may comprise a first pressing member for retaining the support frame, a second pressing member for retaining the semiconductor device, and a pressure applying unit for applying pressure to the first and second pressing members such that the first and second pressing members get closer to each other. In this case, the elastic member is placed in at least one of the portions between the first pressing member and the support frame and between the second pressing member and the semiconductor device.

Preferably, the elastic member may be formed of a material which is heat resistant and conductive. For example, it can be formed of a conductive silicon rubber. The conductive silicon rubber is heat resistant, so that it can be repeatedly heated without deterioration. Since the silicon conductive rubber is electrically conductive, it does not generate static electricity, thus preventing the attaching of the rubber to the semiconductor device or the support frame due to static electricity. The absence of static electricity also means that the semiconductor device is not damaged by such static electricity.

The adhesive layer may be formed on the support frame in such manner that, when seen from above in a plan view, the outline of the area of the elastic member that comes into contact with the semiconductor device or support frame lies inside the outline of the semiconductor device, and may be at the same time identical to or lying outside the outline of the area of the adhesive layer formed on the support frame.

Semiconductor devices such as a T-BGA might be greatly deformed at their edges during the pressure bonding process. Such deformation may not be fully accommodated by the elastic member. Consequently, there may arise voids in the adhesive at the edges of the semiconductor device, or the semiconductor device may peel off the support frame. These problems are addressed by the present invention whereby the outline of the area of the elastic member that comes into contact with the semiconductor device or support frame is smaller than the outline of the semiconductor device. This insures that the elastic member does not contact the potential warping at the edges of the support frame or the semiconductor device, even when the warping is large. Accordingly, the elastic member can function to uniformly apply bonding pressure to the adhesive layer. On the other hand, by specifying that the outline of the contacting area of the elastic member is identical to or larger than the outline of the adhesive layer, the support-frame bonding apparatus can apply a more uniform bonding pressure to the edges of the adhesive layer.

DETAILED DESCRIPTION OF THE PREFERRED EMBODIMENT

Figure 1:
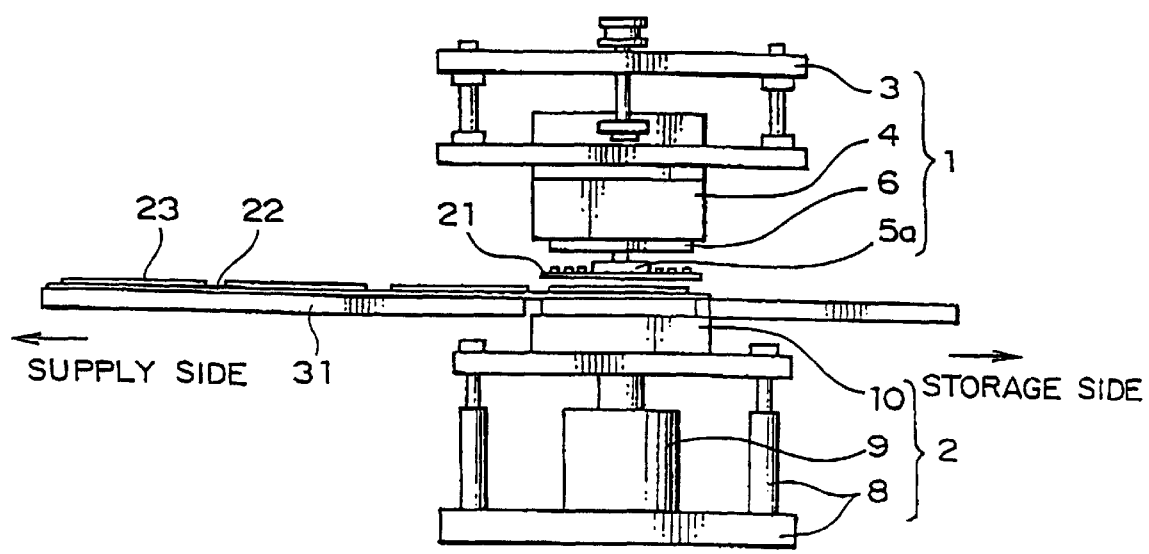
FIG. 1 is a front elevation view showing a support-frame bonding apparatus according to an embodiment of the invention.
Figure 2:
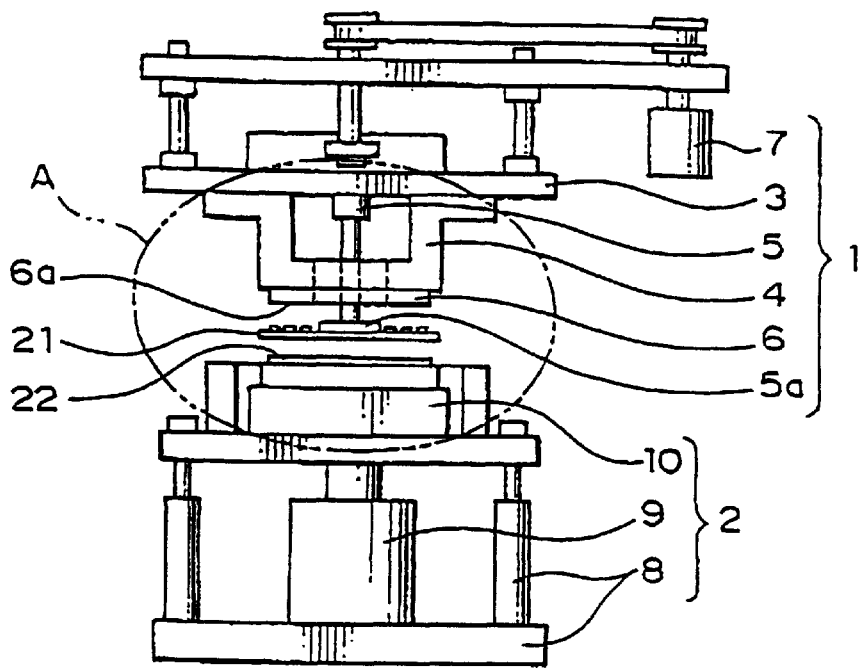
FIG. 2 is a side elevation view showing the support-frame bonding apparatus according to the embodiment of the invention.

A support-frame bonding apparatus according to an embodiment of the present invention will be described with reference to the accompanying drawings. First, the structure of the support-frame bonding apparatus according to the embodiment will be described. FIG. 1 shows a front elevation view of the support-frame bonding apparatus according to the embodiment and also part of the peripheral equipment. FIG. 2 shows the support-frame bonding apparatus in a side elevation view.

As shown in FIG. 1, the support-frame bonding apparatus according to the embodiment comprises an upper pressing member 1 and a lower pressing member 2 which is disposed below and opposite the upper pressing member 1. Between the upper pressing member 1 and the lower pressing member 2, a semiconductor device 21 such as a T-BGA and a support frame 22 are placed, one above the other, with an adhesive layer 23 between the device 21 and the support frame 22. The upper pressing member 1 and lower pressing member 2 are adapted to press the semiconductor device 21 and support frame 22 against each other in order to bond them together. In the present embodiment, the semiconductor device 21 is comprised of a T-BGA. The peripheral equipment, namely a transport unit 31 as shown in FIG. 1, carries support frame 22 from the supply side to where the bonding process is to take place in the support-frame bonding apparatus. After the bonding, transport unit 31 carries the bonded product to the storage side.

As shown in FIGS. 1 and 2, the upper pressing member 1 comprises a support member 3, a pressing tool 4, a suction nozzle 5, an elastic member 6 and a motor 7. The support member 3 can be horizontally moved by a transport mechanism (not shown) provided above the support member 3. The support member 3 operates to carry the pressing tool 4, suction nozzle 5, elastic member 6 and motor 7 to a desired location. The motor 7 is fixedly attached to the support member 3, and adapted to move the pressing tool 4 up or down in order to apply pressure to the semiconductor device 21 and support frame 22. The pressing tool 4 applies pressure to the semiconductor device 21 and support frame 22 via the elastic member 6. Since the pressing tool 4 hangs from the support member 3, the pressing tool 4 can be moved up or down in response to the operation of the motor 7.

Figure 3:
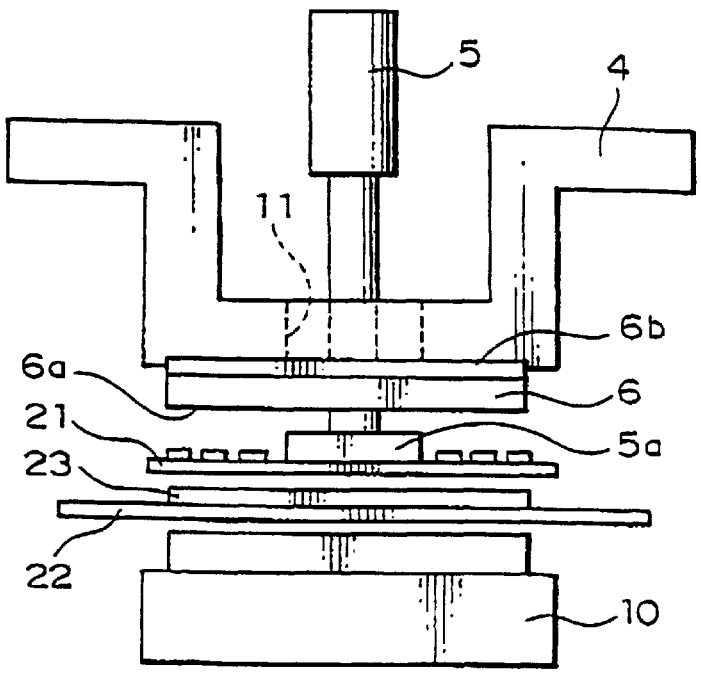
FIG. 3 is an enlarged side elevation view showing the portion of the embodiment indicated by the capital letter A in FIG. 2.

FIG. 3 shows an enlarged view of the portion of the apparatus shown in FIG. 2, which is circled and indicated by the capital letter A. In this figure, the support member 3 is not shown. The elastic member 6 functions to uniformly distribute the pressure applied by the pressing tool 4 to the adhesive layer 23 when pressing the semiconductor device 21. As shown in FIG. 3, the elastic member 6, which is board-like in shape, is attached to the bottom surface of pressing tool 4. In the embodiment, the elastic member 6 is formed of a conductive silicon rubber and bonded to the bottom surface of pressing tool 4 by baking. Accordingly, there is formed a baked layer 6b on the side of elastic member 6 facing the pressing tool 4. The elastic member 6 is provided with a satin finish on a surface 6a which is to contact the semiconductor device 21 as the elastic member 6 presses the semiconductor device 21. The outline of surface 6a is substantially identical to the outline of the area of adhesive layer 23 formed on the support frame 22. The elastic member 6 has an opening 11 at its center as seen from the surface 6a for allowing the passage of a suction member 5a of the suction nozzle 5.

The suction nozzle 5, which is fixedly attached to the support member 3 above the pressing tool 4, is operable to suck and thereby hold the semiconductor device 21. The suction member 5a of suction nozzle 5 can be vertically moved, so that it can be lowered past the opening 11 provided in the elastic member 6 and further below the elastic member 6 to suck the semiconductor device 21. Accordingly, the semiconductor device 21 can be transferred, while being sucked by the suction nozzle 5, from the metal mold portion (not shown) in a previous step to a predetermined bonding position by the transport mechanism (not shown) transporting the support member 3. Furthermore, the suction nozzle 5 can hold the semiconductor device 21 at the bonding position.

As shown in FIGS. 1 and 2, the lower pressing member 2 comprises a pedestal 8, a pressing cylinder 9 and a pressing stage 10. The pedestal 8, which is fixed to the floor, supports the pressing cylinder 9 and pressing stage 10. The pressing cylinder 9 is fixed to the pedestal 8, and its upper surface connects to the lower surface of the pressing stage 10. The pressing cylinder 9 generates pressure to be applied to the pressing support frame 22 and semiconductor device 21. The pressing stage 10, which is disposed on the pressing cylinder 9, can be moved vertically by the operation of pressing cylinder 9. The pressing stage 10 heats the support frame 22 and semiconductor device 21, as well as transmitting the pressure provided by the pressing cylinder 9 to them.

Figure 4A:
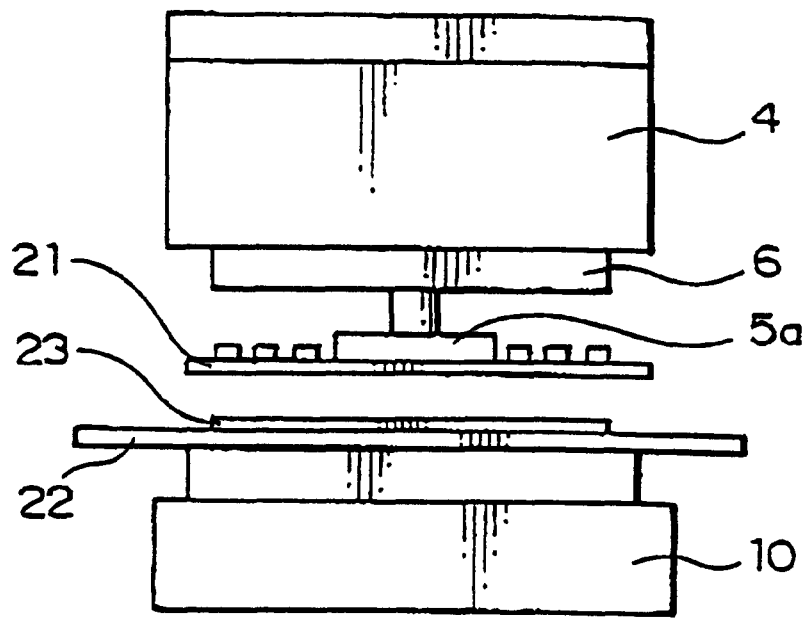
FIGS. 4A to 4D are front elevation views showing the operation of the support-frame bonding apparatus in a sequential order respectively.

The operation of the support-frame bonding apparatus will be described with reference to FIGS. 4A to 4D, which show the operation thereof in a sequential order. First, as shown in FIG. 4A, the transport unit 31 (see FIG. 1) transports a quadruple support frame 22, for example, from the supply side (see FIG. 1) to the support-frame bonding apparatus and places it on the pressing stage 10. The pressing stage 10 is typically preheated to a temperature of about 120° C. The quadruple support frame refers to a series of support frames for four semiconductor devices. The adhesive layer 23 is formed on the side of support frame 22 which is to be bonded to the semiconductor device 21. The adhesive layer 23 has an outline in a plan view which is smaller than that of the semiconductor device 21.

Meanwhile, the semiconductor device 21 is obtained after the cutting step in a cutting section (not shown) in the previous step. The semiconductor device 21 is then sucked by the suction member 5a of suction nozzle 5 (see FIG. 3). As the support member 3 is moved horizontally by the transport mechanism (not shown), the semiconductor device 21, while being sucked by the suction member 5a, is transported from the cutting section to an area above the support frame 22 mounted to the pressing stage 10 where it is held.

Figure 4B:
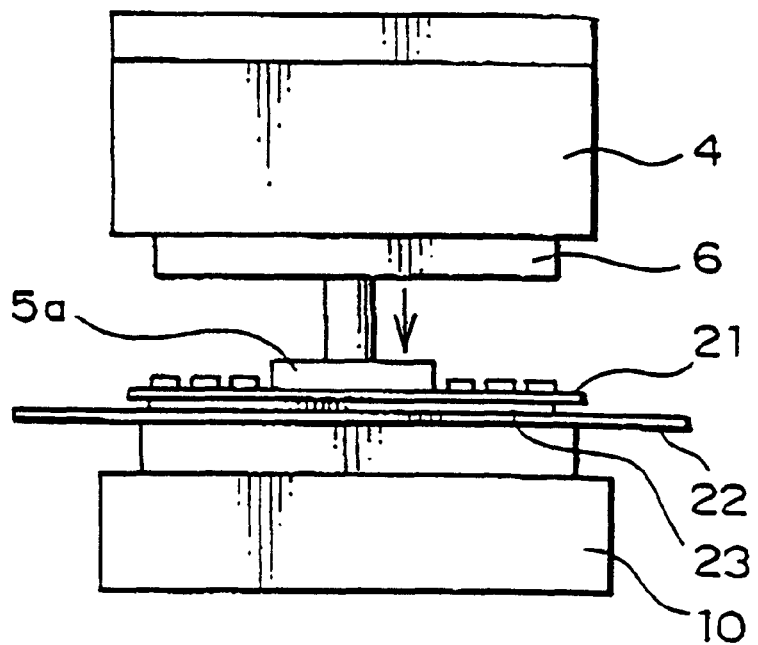

Thereafter, as shown in FIG. 4B, the semiconductor device 21 descends while being sucked by the suction member 5a of the suction nozzle 5, and properly placed on the support frame 22. The placement is carried out in such a manner that the adhesive layer 23 lies within the area of support frame 22 which is covered by the semiconductor device 21. Thus the semiconductor device 21 comes into contact with the adhesive layer 23.

Figure 4C:
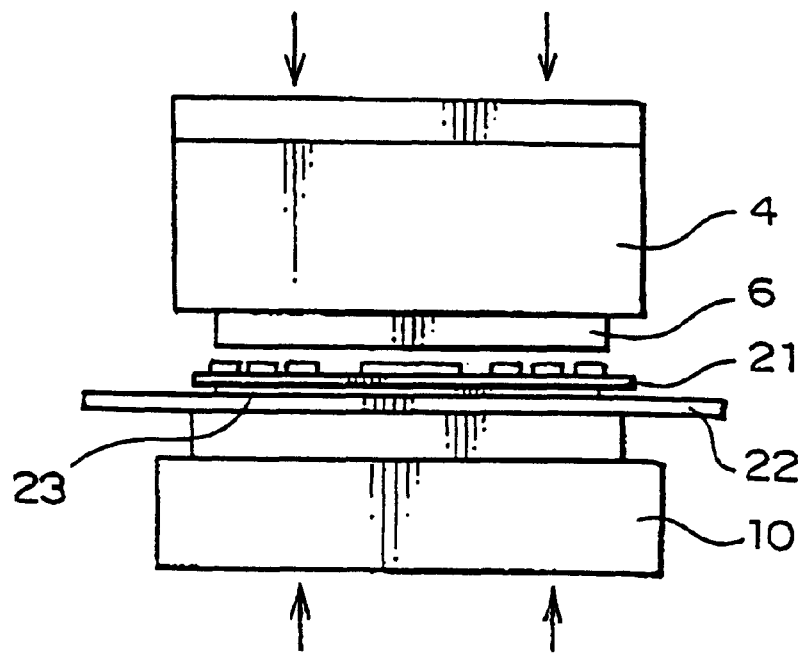
Figure 4D:
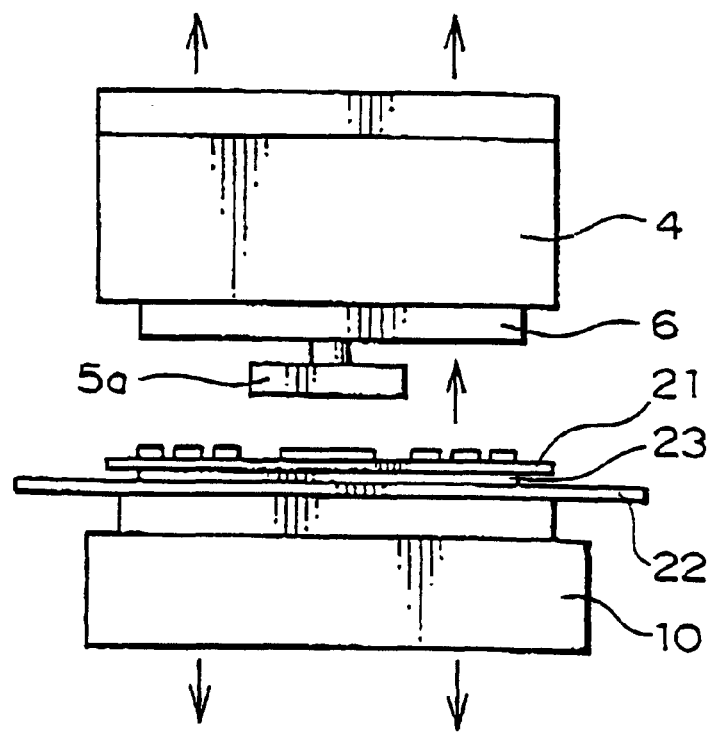

In the next step, as shown in FIG. 4C, the motor 7 (see FIG. 2) operates to lower the pressing tool 4, whereby the elastic member 6 contacts the semiconductor device 21. Thus, the elastic member 6 is provided to the portion between the pressing tool 4 and the semiconductor device 21. At the same time, the pressing cylinder 9 (see FIG. 2) operates to raise the pressing stage 10. Consequently, the support frame 22 and semiconductor device 21 are pressed against each other with a certain pressure by the elastic member 6 and pressing stage 10. Simultaneously, the pressing stage 10 heats the support frame 22, adhesive layer 23 and semiconductor device 21. This pressing operation is maintained for about four seconds to form a bond between the semiconductor device 21 and support frame 22 via the adhesive layer 23. Thus, the semiconductor device 21 first contacts the adhesive layer 23 formed on the support frame 22, is then pressed by the elastic member 6 and pressing stage 10 while being heated at about 120° C. for four seconds, and finally bonded to the support frame 22.

After the bonding, the pressing cylinder 9 (see FIG. 2) is operated to release the pressure applied to the support frame 22 and semiconductor device 21 via the pressing stage 10. Further, the suction nozzle 5 (see FIG. 3) terminates the suction of the semiconductor device 21 by the suction member 5a and moves up the suction member 5a. Thereafter, the motor 7 (see FIG. 2) is activated to raise the pressing tool 4, thus lifting the elastic member 6 off the semiconductor device 21.

The support frame 22 and semiconductor device 21 now bonded to the support frame 22 is then carried to the storage side (see FIG. 1) by the transport unit 31 (see FIG. 1), and the bonding process is completed. The above-described series of bonding steps are repeated four times to attach four semiconductor devices 21 to quadruple support frame 22.

It should be apparent from the foregoing description that the support-frame bonding apparatus according to the embodiment of the invention provides a number of advantageous effects. Since the elastic member 6 has on its surface 6a a satin finish, it does not stick to the semiconductor device 21 after the device has been bonded to the support frame 22.

Furthermore, as the elastic member 6 is formed from electrically conductive silicon rubber, it has an excellent heat resistant property and does not deteriorate after repeating the bonding process. The elastic member 6 is also conductive, so that it does not cause any static electricity, thereby preventing the damage to the semiconductor device 21 by static electricity. The attachment of elastic member 6 to the semiconductor device 21 due to static electricity can also be prevented.

The outline of surface 6a of the elastic member 6, as seen from above, is identical to the adhesive layer 23 and yet smaller than the outline of semiconductor device 21. This allows the pressure to be uniformly applied to the adhesive layer 23 even if there is a large warping at the edges of semiconductor device 21 or support frame 22, or if the edges of semiconductor device 21 have been deformed during the pressure-bonding process. Accordingly, such quality defects as the generation of voids in the adhesive layer 23 and the separation between the semiconductor device 21 and support frame 22 can be prevented.

Because of the baking method employed to join the elastic member 6 to the surface of pressing tool 4, the elastic member 6 does not peel off the pressing tool 4 even after being repeatedly heated and cooled during the bonding process with the associated thermal stress.

While the foregoing embodiment has been described with specific values and arrangements, it is to be understood that such embodiment is merely illustrative and not restrictive. For example, the temperature of pressing stage 10 and the duration of application of pressure may be other than as specified above, i.e. other than 120° C. and 4 sec., because these values are dependent on the kind of the adhesive used in the adhesive layer 23.

Likewise, the elastic member 6 may be attached to the upper surface of pressing stage 10 instead of the lower surface of pressing tool 4, or to both.

The present invention can also be realized with different types of semiconductor device than a T-BGA.

Thus it is apparent that the support-frame bonding apparatus according to the embodiment is capable of bonding a semiconductor device 21 such as a T-BGA to the support frame 22 without having the elastic member 6, which is provided to uniformly distribute the bonding pressure, stick to the semiconductor device 21 or the support frame 22. The semiconductor device 21 is further protected from damage due to static electricity, which can be generated in the elastic member 6 according to the prior art. The apparatus according to the embodiment can furthermore achieve a satisfactory bonding between the semiconductor device 21 and the support frame 22 even if there is a large warping in either the semiconductor device or the support frame. The support-frame bonding apparatus according to the embodiment of the present invention can bond the semiconductor device and the support frame efficiently and reliably, thereby greatly contributing to reducing the manufacturing cost of semiconductor devices provided with the support frame.

What is claimed is:

1. A support-frame bonding apparatus for bonding via an adhesive layer a support frame to a semiconductor device mounted on a TAB tape, comprising:

at least one elastic member provided with a satin finish on its surface;

a pressing unit which presses said semiconductor device, said adhesive layer, said support frame and said elastic member against each other, while said semiconductor device and said support frame are superposed via said adhesive layer and said at least one elastic member is provided to at least one of the outer surfaces of said semiconductor device and said support frame which are not the superposed surfaces of said semiconductor device and said support frame so as to contact said satin finish surface with said outer surface of said semiconductor device or said support frame; and a heating unit for heating said adhesive layer to bond said semiconductor device to said support frame via said adhesive layer.

2. The support-frame bonding apparatus according to claim 1, wherein said pressing unit comprises:

a first pressing member for holding said support frame;

a second pressing member for holding said semiconductor device; and a pressure applying unit for applying a pressing force to said first and second pressing members such that they get closer to each other, wherein said elastic member is provided to at least one of the portions between said first pressing member and said support frame and between said second pressing member and said semiconductor device.

3. The support-frame bonding apparatus according to claim 1, wherein said elastic member is formed of a heat-resistant material.

4. The support-frame bonding apparatus according to claim 1, wherein said elastic member is formed of a conductive material.

5. The support-frame bonding apparatus according to claim 4, wherein said elastic member is formed of a conductive silicon rubber.

6. The support-frame bonding apparatus according to claim 1, wherein said adhesive layer is formed on said support frame.

7. The support-frame bonding apparatus according to claim 6, wherein, in a plan view, an outline of an area of said elastic member that contacts said semiconductor device or said support frame lies inside an outline of said semiconductor device and is either identical to or outside an outline of an area of said adhesive layer formed on said support frame.

8. The support-frame bonding apparatus according to claim 1, wherein said elastic member is bonded to said pressing unit by baking.

9. The support-frame bonding apparatus according to claim 2, wherein said first pressing member is disposed directly below said second pressing member.

10. The support-frame bonding apparatus according to claim 9, wherein said first pressing member includes a stage on which said support frame is placed.

11. The support-frame bonding apparatus according to claim 9, wherein said second pressing member includes a suction nozzle for holding said semiconductor device by suction.

12. The support-frame bonding apparatus according to claim 2, wherein said pressure applying unit applies force to said first pressing member such that said first pressing member approaches said second pressing member.

* * * * *